(12) United States Patent
Aisenbrey

(10) Patent No.: US 6,940,468 B2
(45) Date of Patent: Sep. 6, 2005

(54) TRANSFORMERS OR INDUCTORS ("TRANSDUCTORS") AND ANTENNAS MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 27 days.

(21) Appl. No.: 10/782,364

(22) Filed: Feb. 19, 2004

(65) Prior Publication Data

US 2004/0164923 A1 Aug. 26, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.
(60) Provisional application No. 60/456,969, filed on Mar. 24, 2003, provisional application No. 60/317,808, filed on Sep. 7, 2001, provisional application No. 60/269,414, filed on Feb. 16, 2001, and provisional application No. 60/268,822, filed on Feb. 15, 2001.

(51) Int. Cl.$^7$ .............................................. H01Q 21/00
(52) U.S. Cl. ..................... 343/867; 343/742; 343/895; 336/234
(58) Field of Search ............................... 343/741, 742, 343/787, 788, 866, 867, 895; 336/192, 199, 233, 234

(56) References Cited

U.S. PATENT DOCUMENTS

| | | | |
|---|---|---|---|
| 3,717,833 A | 2/1973 | Kubota et al. | 336/69 |
| 4,035,710 A | 7/1977 | Joyce | 363/37 |
| 4,748,436 A | 5/1988 | Kanamori et al. | 338/214 |
| 5,654,881 A | 8/1997 | Albrecht et al. | 363/25 |

(Continued)

FOREIGN PATENT DOCUMENTS

| | | | |
|---|---|---|---|
| EP | 0117700 A | 2/1984 | H01B/1/22 |
| EP | 944099 A | 10/1998 | H01B/7/02 |
| GB | 2377449 A | 1/2003 | C08K/3/08 |
| JP | 05276752 | 10/1993 | H02M/7/04 |
| JP | 2000-169641 | 6/2000 | C08L/23/08 |

OTHER PUBLICATIONS

U.S. Appl. No. 10/780,214, filed Feb. 17, 2004, "Low Cost Antennas and Electro-magnetic (EMF) Absorption in Electronic Circuit Packages or Transceivers Using Conductive Loaded Resin-Based Materials", assigned to the same assignee.

Primary Examiner—Tan Ho
(74) Attorney, Agent, or Firm—George O. Saile; Stephen B. Ackerman; Larry J. Prescott

(57) ABSTRACT

A low cost moldable transformer or trans-inductor core, referred to in this description as a transductor. Elements of the transductor core are formed of a conductive loaded resin-based material. The conductive loaded resin-based material comprises micron conductor fibers, micron conductor powders, or in combination thereof homogenized within a base resin host wherein the ratio of the weight of the conductor fibers, conductor powders, or combination thereof to the weight of the base resin host can be between about 0.20 and 0.40. The micron conductive fibers or powders, can be of stainless steel, nickel, copper, silver, carbon, graphite, plated particles, plated fibers, or the like. Transductors can be formed using methods such as injection molding, overmolding, thermo-set, protrusion, extrusion, compression, or the like, in combination with a large number of production or wire wrapping techniques to achieve desired electrical characteristics. The elements and/or cores of the transductor can be virtually any shapes and sizes desired. Parts may also can be cut, stamped, milled or the like, from molded conductive loaded materials that are in sheet or other various forms. The conductive loaded resin-based material provides very efficient coupling and control of electromagnetic energy between a bobbin formed of the conductive loaded resin-based material and a coil of wire wound on the bobbin.

31 Claims, 9 Drawing Sheets

U.S. PATENT DOCUMENTS

| | | |
|---|---|---|
| 5,771,027 A | 6/1998 | Marks et al. ................ 343/912 |
| 5,796,324 A * | 8/1998 | Ross et al. .................. 336/192 |
| 6,249,261 B1 | 6/2001 | Solberg, Jr. et al. ........ 343/801 |
| 6,741,221 B2 * | 5/2004 | Aisenbrey ................... 343/897 |
| 6,870,516 B2 * | 3/2005 | Aisenbrey ................... 343/873 |
| 6,873,240 B2 * | 3/2005 | Nakatsu et al. .............. 336/200 |
| 2003/0038699 A1 * | 2/2003 | Nakatsu et al. .............. 336/206 |
| 2004/0183645 A1 * | 9/2004 | Takaya et al. ............... 336/234 |
| 2005/0052271 A1 * | 3/2005 | Nakatsu et al. .............. 336/206 |

\* cited by examiner

TRANSFORMERS OR INDUCTORS ("TRANSDUCTORS") AND ANTENNAS MANUFACTURED FROM CONDUCTIVE LOADED RESIN-BASED MATERIALS

This Patent Application claims priority to the U.S. Provisional Patent Application No. 60/456,969, filed Mar. 24, 2003, which is herein incorporated by reference in its entirety.

This Patent Application is a Continuation-in-Part as U.S. patent application Ser. No. 10/309,429, filed on Dec. 4, 2002 now U.S. Pat. No. 6,870,516, also incorporated by reference in its entirety, which is a Continuation-in-Part application, filed as U.S. patent application Ser. No. 10/075,778, filed on Feb. 14, 2002 now U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to "transductors", or transformer/inductor like devices, and/or antennas formed by the molding process of conductive loaded resin-based materials comprising micron conductive powders or micron conductive fibers or in combination thereof.

(2) Description of the Related Art

Transformer/inductor like devices are used alone or in conjunction with antennas to perform a multitude of functions in electronic circuitry, such as controlling currents within antennas or transceivers. These devices are important to the overall functionality of the electronics or the devices.

U.S. Pat. No. 5,771,027 to Marks et al. describes a composite antenna having a grid comprised of electrical conductors woven into the warp of a resin reinforced cloth forming one layer of a multi-layer laminate structure of an antenna.

U.S. Pat. No. 6,249,261 B1 to Solberg, Jr. et al. describes a direction-finding material constructed from polymer composite materials, which are electrically conductive.

U.S. Pat. No. 4,768,436 to Kanamori et al. describes a high voltage resistance wire formed of a conductive composite mixed with a polymer.

U.S. Pat. No. 5,654,881 to Albrecht et al. describes a single stage power converter. The converter uses a transinductor, a multiple winding inductive element, having a primary winding providing energy storing inductance.

U.S. Pat. No. 4,035,710 to Joyce describes a voltage regulator-converter/power converter, which uses a transinductor, a multiple winding inductive element.

U.S. patent application Ser. No. 10/780,214, filed on Feb. 17, 2004, entitled "LOW COST ANTENNA AND ELECTRO MAGNETIC (EMF) ABSORBTION IN ELECTRONIC CIRCUIT PACKAGES OR TRANSCIEVERS USING CONDUCTIVE LOADED RESIN-BASED MATERIALS) assigned to the same assignee describe low cost antennas and electromagnetic absorption structures using conductive loaded resin-based materials.

SUMMARY OF THE INVENTION

Transformer/inductor like devices are an essential part of electronic circuitry, such as electronic communication systems that contain wireless links. Lowering the cost and improving the manufacturing capabilities for these devices provides an important advantage for these systems. Low cost molded transductors offer significant advantages for these systems not only from a fabrication standpoint, but also characteristics related to 2D, 3D, 4D, and 5D electrical characteristics, which include the physical advantages that can be achieved by the molding process of the actual parts and the polymer physics within the conductive networks formed within the molded part.

Transformer/inductor like devices which have wire windings around a core of conductively loaded resin-based material, and which may also use the core(s) for a secondary winding, are of great usefulness in coupling and controlling energy, impedance, VSWR, resonance and frequency of oscillation in these types of systems. These devices will hereinafter be referred to as transductors. Antennas can frequently be coupled to these wire windings in applications such as communications and navigation, which require reliable sensitive antennas. Lowering the materials and/or fabrication costs combined with added performance for these transductors offer significant advantages for many system design applications utilizing antennas.

It is a principle objective of this invention to provide a low cost, high performance, and efficient molded core of conductively loaded resin-based material, which is then wire wound as an electrical energy transformer or trans-inductor, hereinafter referred to as a transductor. The core is fabricated from molded conductive loaded resin-based materials, comprising micron conductive fibers, micron conductive powders, or in combination thereof, that are homogenized within a base resin host in a molding process.

It is another principle objective of this invention to provide a method of fabricating a low cost, high performance, and efficient molded core of conductively loaded resin-based material, which is then wire wound as an electrical energy transformer or trans-inductor, herein be referred to as a transductor. The core is fabricated from molded conductive loaded resin-based materials comprising micron conductive fibers, micron conductive powders, or in combination thereof, that are homogenized within a base resin during the molding process.

These objectives are achieved by molding the transductor core elements from conductive loaded resin-based materials. These materials are resins loaded with conductive materials to provide a resin-based material, which is a conductor rather than an insulator. The resins provide the structural material which; when loaded with micron conductive powders, micron conductive fibers, or any combination thereof, become composites which are conductors rather than insulators. The orientation of micron conductive fibers, micron conductive powders or in combination thereof, homogenized within the base resin may be tightly controlled in the molding process. Various desired electrical and EMF characteristics may be achieved during the molding and mix process.

These materials can be molded into any number of desired shapes and sizes using methods such as injection molding, over-molding, thermo-set, protrusion, extrusion, compression, or the like, in combination with a large number of production or wire gauges, wrapping techniques and winding(s) to achieve desired electrical characteristics for a transductor. The conductive loaded resin-based material could also be a molded part, sheet, bar stock, or the like that may be cut, stamped, milled, laminated, vacuumed formed, or the like to provide the desired shape and size of this element or part. The characteristics of the elements depend on the composition of the conductive loaded resin-based materials, which can be adjusted and tightly controlled in achieving the desired characteristics of the molded material.

DESCRIPTION OF THE PREFERRED EMBODIMENTS

Figure 1:
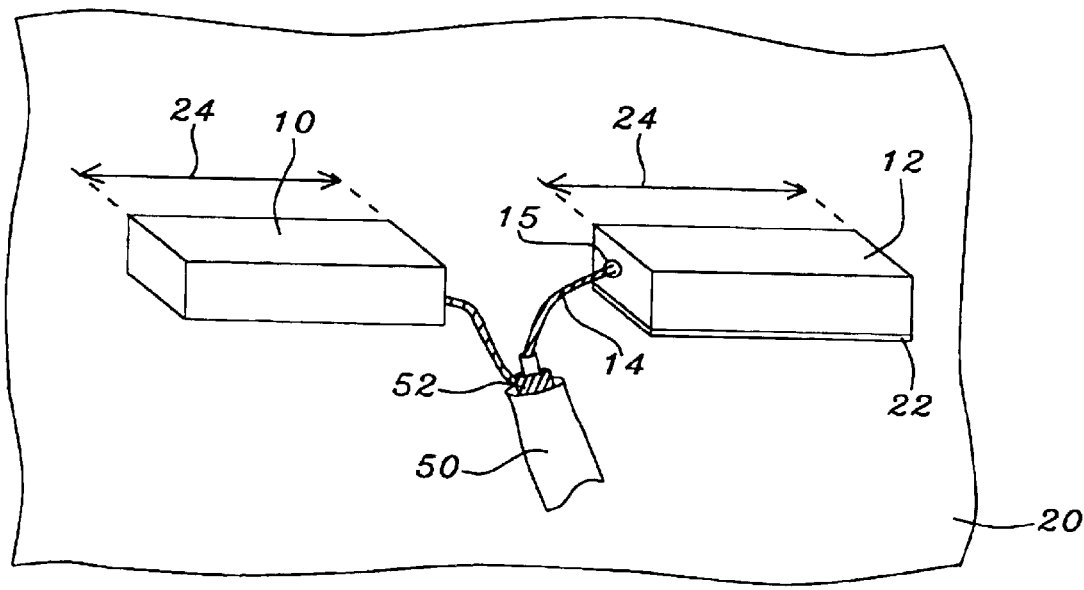
FIG. 1 shows a perspective view of a dipole antenna formed from a conductive loaded resin-based material.

The following embodiments are examples of antennas, ground planes, and transductors, fabricated using conductive loaded resin-based materials. In some of the examples the ground planes can be formed of either conductive loaded resin-based materials or in combination or unison with metals such as circuit boards or the like contained within the device as a counterpoise. The use of conductive loaded resin-based materials in the fabrication of antennas, ground planes, and transductor elements significantly lowers the cost of materials and manufacturing processes used and the ease of forming these materials into the desired shapes. These materials can be used to manufacture either receiving or transmitting antennas and any combination of antennas and/or transductors. The antennas, ground planes, and transductor elements can be formed in infinite shapes using conventional methods such as injection molding, over-molding, thermo-set, protrusion, extrusion, compression or the like, when manufactured with conductive loaded resin-based materials.

The conductive loaded resin-based materials when molded typically but not exclusively produce a desirable usable range of resistivity from less than 5 to greater than 25 ohms per square. The selected materials used to build the transductor elements are homogenized together using molding techniques and/or methods such as injection molding, over-molding, thermo-set, protrusion, extrusion, compression, or the like.

The conductive loaded resin-based materials comprise micron conductive powders, micron conductive fibers, or in any combination thereof. The materials are homogenized together within the resin, during-the molding process, yielding an easy to produce low cost, electrically conductive, close tolerance manufactured part or circuit. The micron conductive powders can be of carbons, graphite's, amines or the like, and/or of metal powders such as nickel, copper, silver, or plated or the like. The use of carbons or other forms of powders such as graphite(s) etc. can create additional low activity level electron exchange and, when used in combination with micron conductive fibers, a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like. The structural material can be any polymer base resin. While the resin selection(s) also plays a roll in dielectric, dielectric loss tangents, permeability and or other related electrical characteristics within the vast selection of base resins. Structural material(s) can be, here given as examples and not as an exhaustive list, polymer resins produced by GE PLASTICS, Pittsfield, Mass., a range of other resins produced by GE PLASTICS, Pittsfield, Mass., a range of other resins produced by other manufacturers, silicones produced by GE SILICONES, Waterford, N.Y., or other flexible resin-based compounds produced by other manufacturers.

The resin-based structural material loaded with micron conductive powders, micron conductive fibers, or in combination thereof can be molded, using very basic methods such as injection molding, overmolding, or extruding the material(s) to the desired shapes. The molded conductive loaded resin-based materials may also be stamped, cut or milled as desired to form the desired shape of the antenna elements or transductor cores. The composition and directionality of the loaded materials can affect the device characteristics and can be precisely controlled in and during the molding process. A resin based laminate could also be fabricated with random webbed micron stainless steel fibers or other conductive fibers, forming a cloth like material which, when properly designed in fiber content(s), orientation(s) and shape(s), can be achieved to realize a very high performance flexible cloth-like antenna. Such a cloth-like antenna could be embedded in a persons clothing as well as in any other materials such as rubber(s) or plastic(s). The random webbed conductive fiber can be laminated or the like to materials such as Teflon, Polyesters, or any resin-based flexible or solid material polymer. When using conductive fibers as a webbed conductor material as part of a laminate the fibers may have diameters of between about 3 and 12 microns, typically between about 8 and 12 microns or in the range of 10 microns with length(s) that can be seamless.

Refer now to FIGS. 1–10B for examples of antennas fabricated using conductive loaded resin-based materials. These antennas can be either receiving and/or transmitting antennas. FIG. 1 shows a perspective drawing of a dipole antenna with a radiating and/or receiving antenna element 12 and a counterpoise antenna element 10 formed from conductive loaded resin-based materials. The antenna comprises a radiating and/or receiving antenna element 12 and a counterpoise antenna element 10 each having a length 24 and a rectangular cross section perpendicular to the length 24. The length 24 is greater than three multiplied by the square root of the cross sectional area. The center conductor 14 of a coaxial cable 50 is electrically connected to the radiating and/or receiving antenna element 12 using a solderable metal insert 15 formed in the radiating and/or receiving antenna element 12. The shield 52 of the coaxial cable 50 is connected to the counterpoise antenna element 10 using a solderable metal insert formed or insert molded in the counterpoise antenna element 10. The metal insert in the counterpoise antenna element 10 is not visible in FIG. 1 but is the same as the metal insert 15 in the radiating and/or receiving antenna element 12. The length 24 is a multiple of a quarter wavelength of the optimum frequency of detection or transmission of the antenna. The impedance of the antenna at resonance should be very nearly equal to the impedance of the coaxial cable 50 to assure maximum power transfer between cable and antenna.

Figure 3:
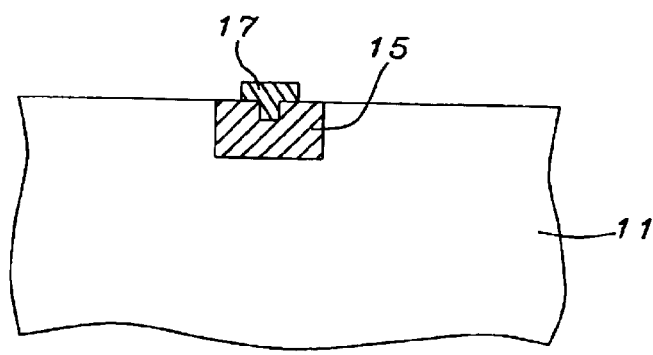
FIG. 3 shows a segment of an antenna element formed from a conductive loaded resin-based material showing a metal insert for connecting to conducting cable elements.

FIG. 3 shows a detailed view of a metal insert 15 formed in a segment 11 of an antenna element. The metal insert can be copper or other metal(s). A screw 17 can be used in the metal insert 15 to aid in electrical connections. Soldering or many other electrical connection methods can also be used.

FIG. 1 shows an example of a dipole antenna with the radiating and/or receiving antenna element 12 placed on a layer of insulating material 22, which is placed on a ground plane 20, and the counterpoise antenna element 10 placed directly on the ground plane 20. The ground plane 20 is optional and if the ground plane is not used the layer of insulating material 22 may not be necessary. As another option the counterpoise antenna element 10 can also be placed on a layer of insulating material 22, see FIG. 2A. If the ground plane 20 is used it can also be formed of the conductive loaded resin-based materials.

Figure 2A:
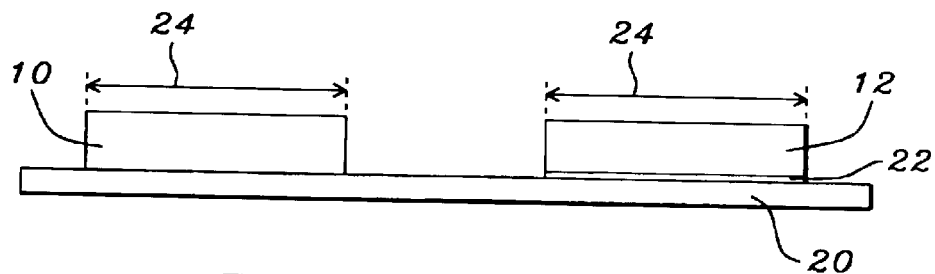
FIG. 2A shows a from view of the dipole antenna of FIG. 1 showing insulating material between the radiating or receiving antenna element and a ground plane.
Figure 2B:
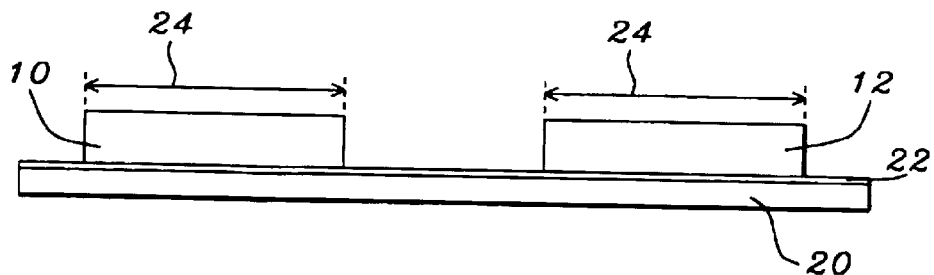
FIG. 2B shows a front view of the dipole antenna of FIG. 1 showing insulating material between both the radiating and/or receiving antenna element and the counterpoise antenna element and a ground plane.

FIG. 2A shows a front view of the dipole antenna of FIG. 1 for the example of an antenna using a ground plane 20, a layer of insulating material 22 between the radiating and/or receiving antenna element 12 and the ground plane 20, and the counterpoise antenna element 10 placed directly on the ground plane 20. FIG. 2B shows a front view of the dipole antenna of FIG. 1 for the example of an antenna using a ground plane 20 and a layer of insulating material 22 between both the radiating and/or receiving antenna element 12 and the counterpoise antenna element 10.

Figure 2C:
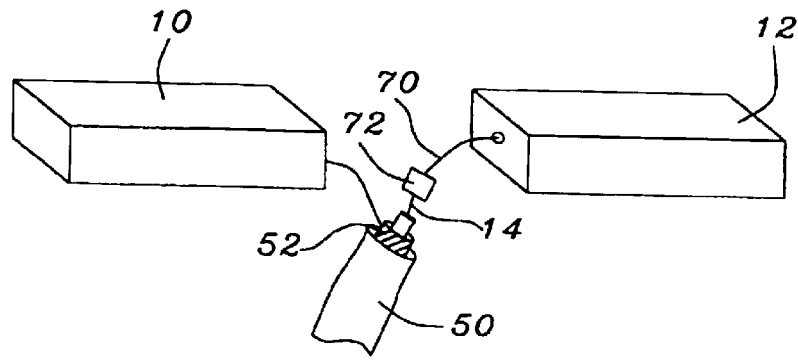
FIG. 2C shows an amplifier inserted between the radiating and/or receiving antenna element and the coaxial cable center conductor for the dipole antenna of FIG. 1.

As shown in FIG. 2C, an amplifier 72 can be inserted between the center conductor 14 of the coaxial cable and the radiating and/or receiving antenna element 12. A wire 70 connects metal insert 15 in the radiating and/or receiving antenna element 12 to the amplifier 72. For receiving antennas the input of the amplifier 72 is connected to the receiving antenna element 12 and the output of the amplifier 72 is connected to the center conductor 14 of the coaxial cable 50. For transmitting antennas the output of the amplifier 72 is connected to the radiating antenna element 12 and the input of the amplifier 72 is connected to the center conductor 14 of the coaxial cable 50.

In one example of this antenna the length 24 is about 1.5 inches with a square cross section of about 0.09 square inches. This antenna had a center frequency of about 900 MHz.

Figure 4A:
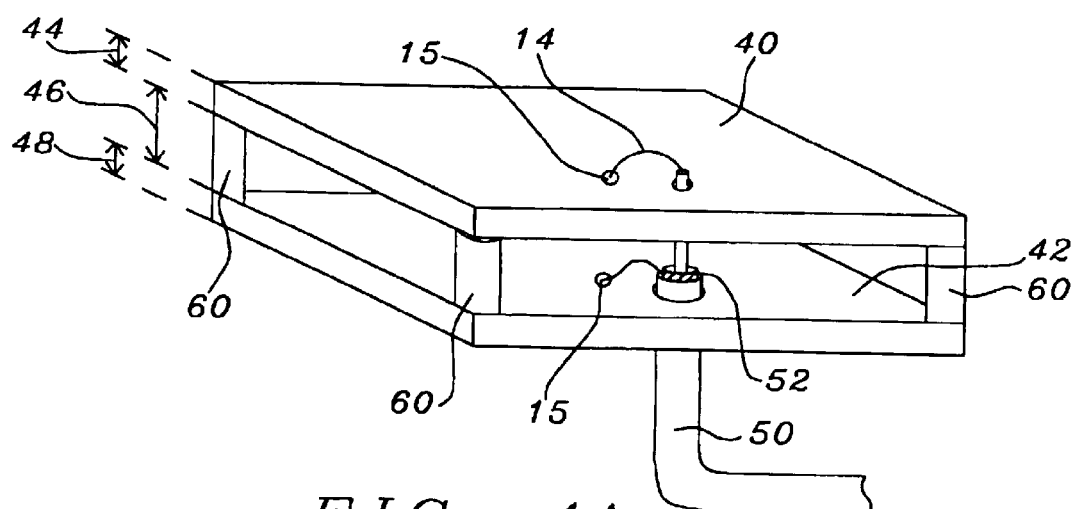
FIG. 4A shows a perspective view of a patch antenna comprising a radiating and/or receiving antenna element and a ground plane with the coaxial cable entering through the ground plane.
Figure 4B:
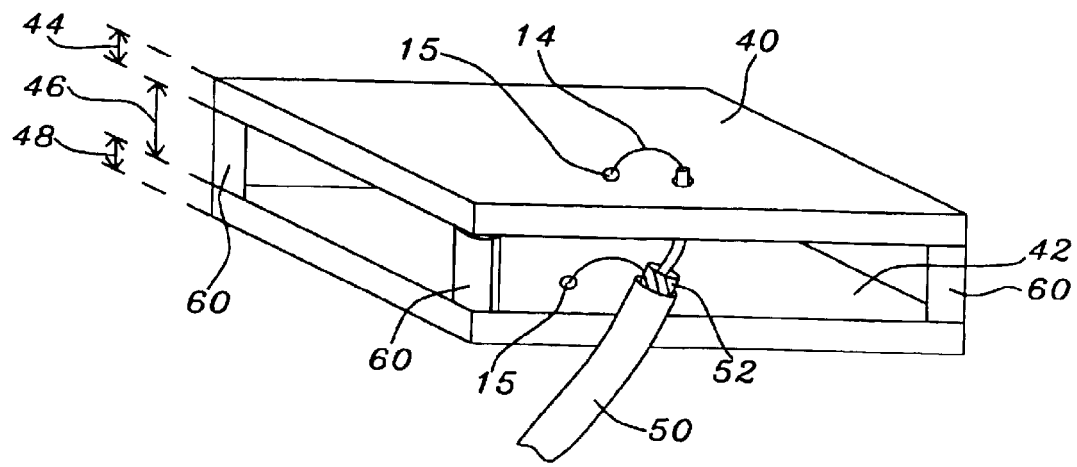
FIG. 4B shows a perspective view of a patch antenna comprising a radiating and/or receiving antenna element and a ground plane with the coaxial cable entering between the ground plane and the radiating and/or receiving antenna element.

FIGS. 4A and 4B show perspective views of a patch antenna with a radiating and/or receiving antenna element 40 and a ground plane 42 formed from conductive loaded resin-based materials. The antenna comprises a radiating and/or receiving antenna element 40 and a ground plane 42 each having the shape of a rectangular plate with a thickness 44 and a separation between the plates 46 provided by insulating standoffs 60. The square root of the area of the rectangular square plate forming the radiating and/or receiving antenna element 40 is greater than three multiplied by the thickness 44. In one example of this antenna wherein the rectangular plate is a square with sides of 1.4 inches and a thickness of 0.41 inches the patch antenna provided good performance at a Global Position System, GPS, frequency of 1,575.42 MHz.

FIG. 4A shows an example of the patch antenna where the coaxial cable 50 enters through the ground plane 42. The coaxial cable shield 52 is connected to the ground plane 42 by means of a metal insert 15 in the ground plane. The coaxial cable center conductor 14 is connected to the radiating and/or receiving antenna element 40 by means of a metal insert 15 in the radiating and/or receiving antenna element 40. FIG. 4B shows an example of the patch antenna where the coaxial cable 50 enters between the radiating and/or receiving antenna element 40 and the ground plane 42. The coaxial cable shield 52 is connected to the ground plane 42 by means of a metal insert 15 in the ground plane 42. The coaxial cable center conductor 14 is connected to the radiating and/or receiving antenna element 40 by means of a metal insert 15 in the radiating and/or receiving antenna element 40.

Figure 5:
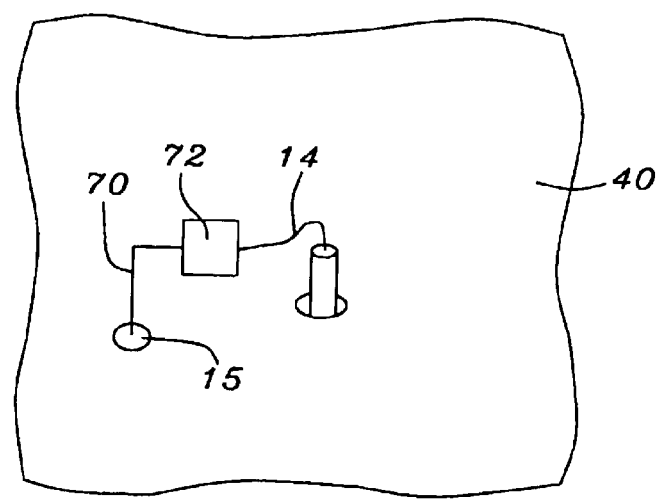
FIG. 5 shows an amplifier inserted between the radiating and/or receiving antenna element and the coaxial cable center conductor for the patch antenna of FIGS. 4A and 4B.

As shown in FIG. 5 an amplifier 72 can be inserted between the coaxial cable center conductor 14 and the radiating and/or receiving antenna element 40. A wire 70 connects the amplifier 72 to the metal insert 15 in the radiating and/or receiving antenna element 40. For receiving antennas the input of the amplifier 72 is connected to the receiving antenna element 40 and the output of the amplifier 72 is connected to the center conductor 14 of the coaxial cable 50. For transmitting antennas the output of the amplifier 72 is connected to the radiating antenna element 40 and the input of the amplifier 72 is connected to the center conductor 14 of the coaxial cable 50.

Figure 6:
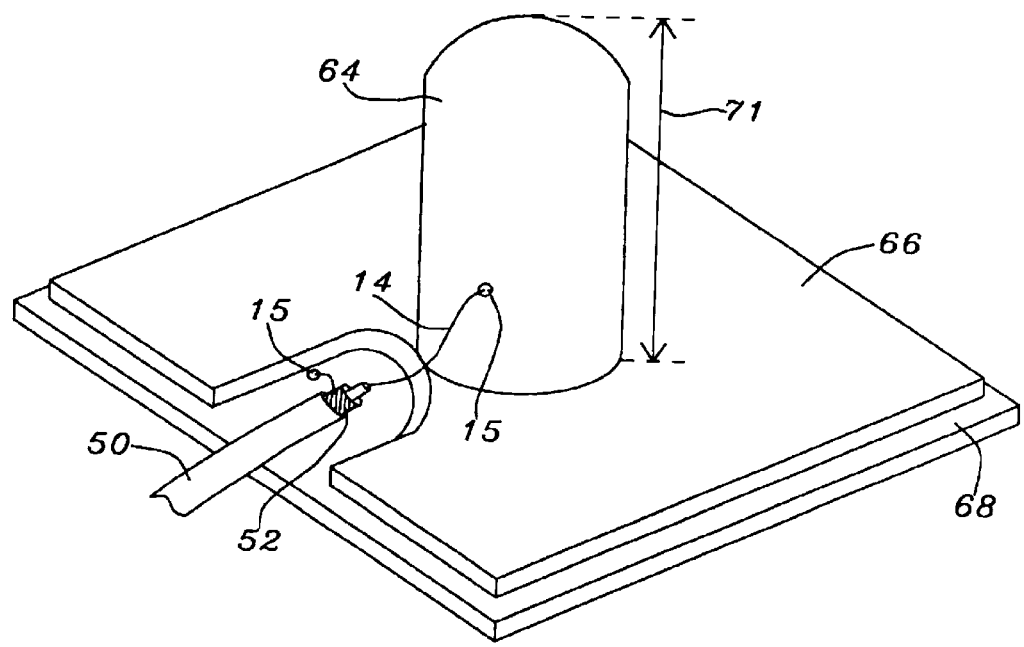
FIG. 6 shows a perspective view of a monopole antenna formed from a conductive loaded resin-based material.

FIG. 6 shows an example of a monopole antenna having a radiating and/or receiving antenna element 64, having a height 71, arranged perpendicular to a ground plane 68. The radiating and/or receiving antenna element 64 and the ground plane 68 are formed of conductive loaded resin-based materials. A layer of insulating material 66 separates the radiating and/or receiving antenna element 64 from the ground plane 68. The height 71 of the radiating and/or receiving antenna element 64 is greater than three times the square root of the cross sectional area of the radiating and/or receiving antenna element 64. An example of this antenna with a height 71 of 1.17 inches performed and matched well at a GPS frequency of 1,575.42 MHz.

Figure 7:
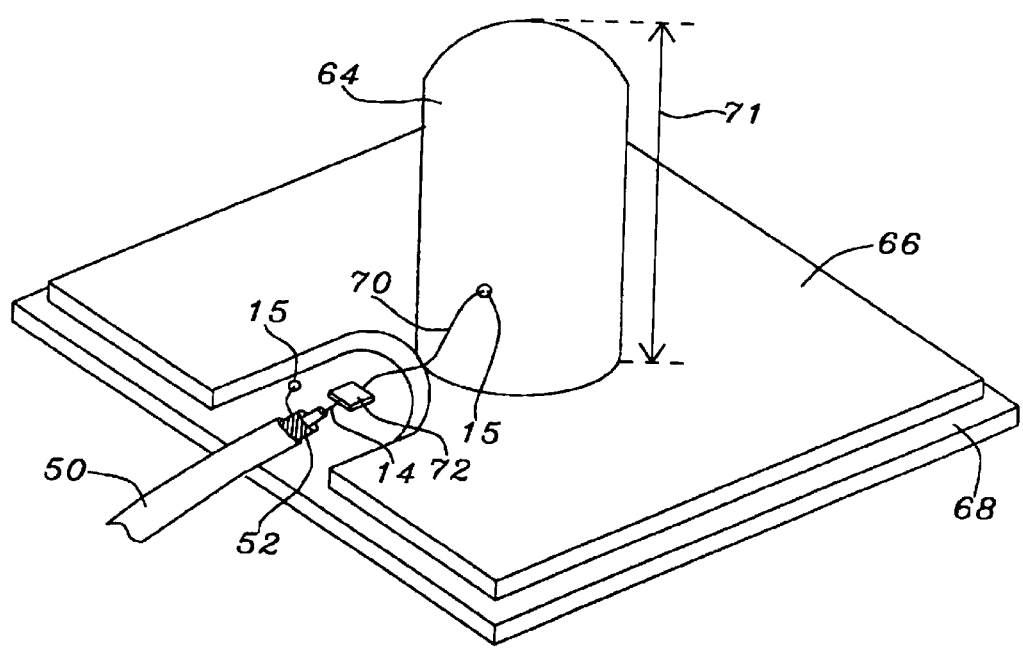
FIG. 7 shows a perspective view of a monopole antenna formed from a conductive loaded resin-based material with an amplifier between the radiating and/or receiving antenna element and the coaxial cable center conductor.

FIG. 7 shows an example of the monopole antenna described above with an amplifier 72 inserted between the center conductor 14 of the coaxial cable 50 and the radiating and/or receiving antenna element 64. For receiving antennas the input of the amplifier 72 is connected to the receiving antenna element 64 and the output of the amplifier 72 is connected to the center conductor 14 of the coaxial cable 50. For transmitting antennas the output of the amplifier 72 is connected to the radiating antenna element 64 and the input of the amplifier 72 is connected to the center conductor 14 of the coaxial cable 50.

Figure 8A:
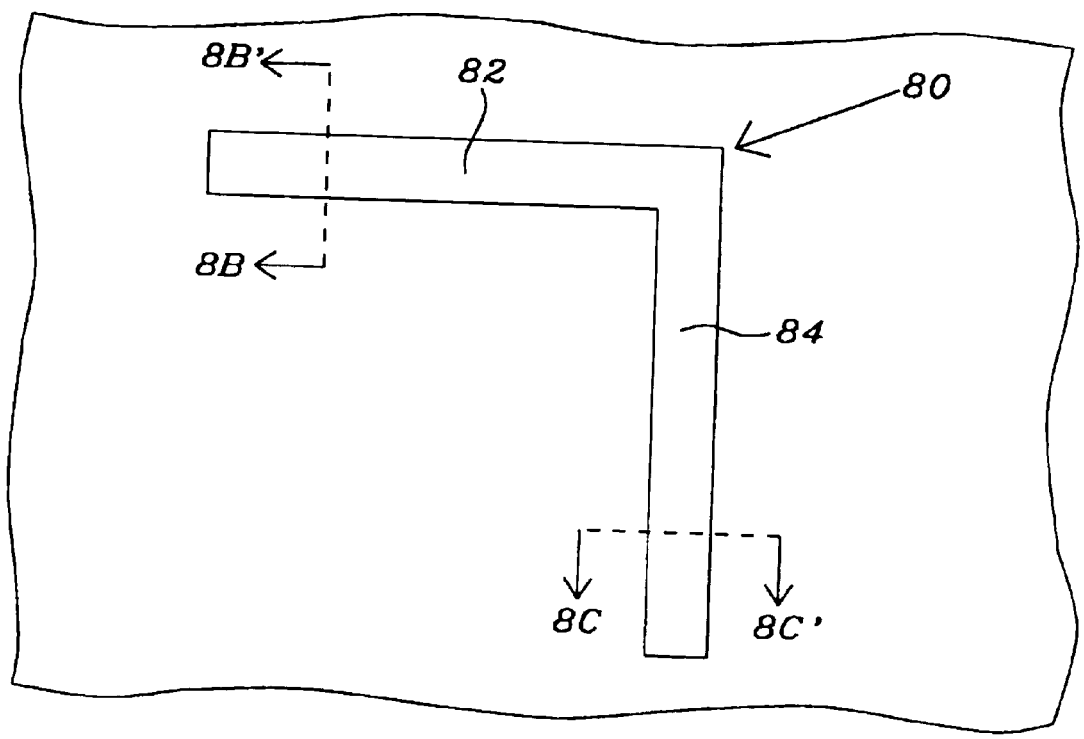
FIG. 8A shows a top view of an antenna having a single L shaped antenna element formed from a conductive loaded resin-based material.
Figure 8B:
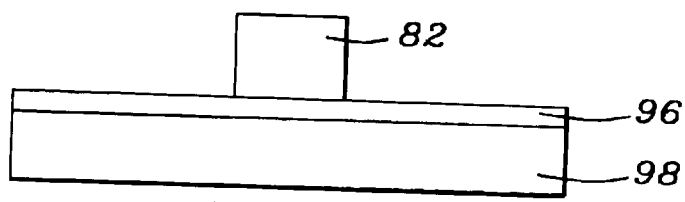
FIG. 8B shows a cross section view of the antenna element of FIG. 8A taken along line 8B–8B' of FIG. 8A.
Figure 8C:
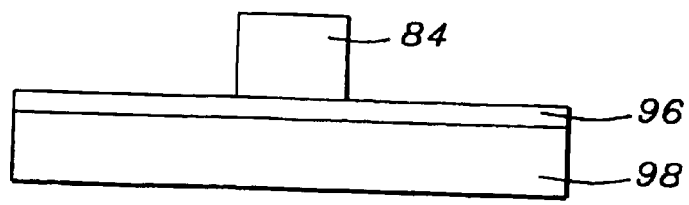
FIG. 8C shows a cross section view of the antenna element of FIG. 8A taken along line 8C–8C' of FIG. 8A.

FIGS. 8A, 8B, and 8C shows an example of an L shaped antenna having a radiating and/or receiving antenna element 80 over a ground plane 98. The radiating and/or receiving antenna element 80 and the ground plane 98 are formed of conductive loaded resin-based materials. A layer of insulating material 96 separates the radiating and/or receiving antenna element 64 from the ground plane 98. The radiating and/or receiving antenna element 80 is made up of a first leg 82 and a second leg 84. FIG. 8A shows a top view of the antenna. FIG. 8B shows a cross section of the first leg 82. FIG. 8C shows a cross section of the second leg 84. FIGS. 8B and 8C show the ground plane 98 and the layer of insulating material 96. The cross sectional area of the first leg 82 and the second leg 84 need not be the same. Antennas of this type may be typically built using overmolding technique(s) to join the conductive resin-based material to the insulating material.

Figure 9A:
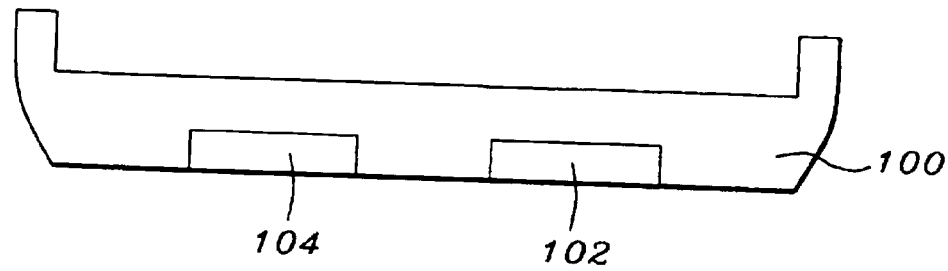
FIG. 9A shows a top view of an antenna formed from a conductive loaded resin-based material molded or formed in an automobile bumper.
Figure 9B:
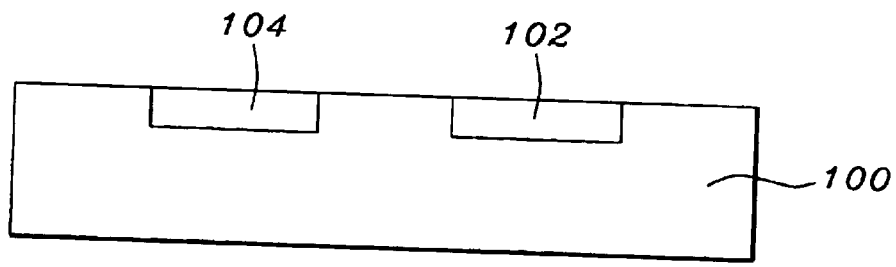
FIG. 9B shows a front view of an antenna formed from a conductive loaded resin-based material molded or formed in an automobile bumper formed of an insulator such as rubber.

Antennas of this type have a number of uses. FIGS. 9A and 9B show a dipole antenna, formed of conductive loaded resin-based materials, molded within an automobile bumper 100, formed of insulating material. The dipole antenna has a radiating and/or receiving antenna element 102 and a counterpoise antenna element 104. FIG. 9A shows the top view of the bumper 100 with the molded antenna. FIG. 9B shows the front view of the bumper 100 with the molded antenna.

Figure 10A:
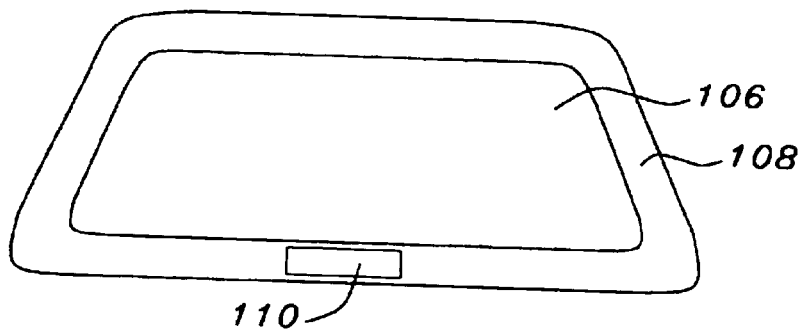
FIG. 10A shows a schematic view of an antenna formed from a conductive loaded resin-based material molded or formed in the molding of a vehicle window.
Figure 10B:
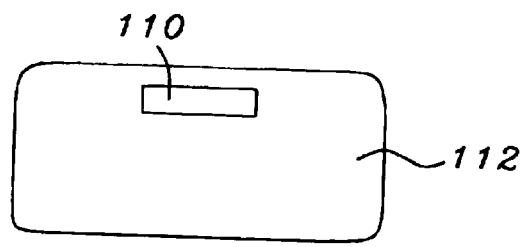
FIG. 10B shows a schematic view of an antenna molded or formed from a conductive loaded resin-based material embedded in the case of a portable electronic device.

Antennas of this type can be used for a number of additional applications and can be molded within, over-molded, or the like within the molding of a window of a vehicle, such as an automobile or an airplane. FIG. 10A shows a schematic view of such a window 106. The antenna 110 can be molded within the molding 108. Antennas of this type can be molded or over-molded within in a plastic or resin based housing, or be part of the plastic or resin based shell itself, of portable or stationary electronic devices such as cellular phones, personal computers, or the like. FIG. 10B shows a schematic view of a segment 112 of such a plastic or resin based housing with the antenna 110 molded, over-molded, inserted or the like in the housing 112.

Figure 11:
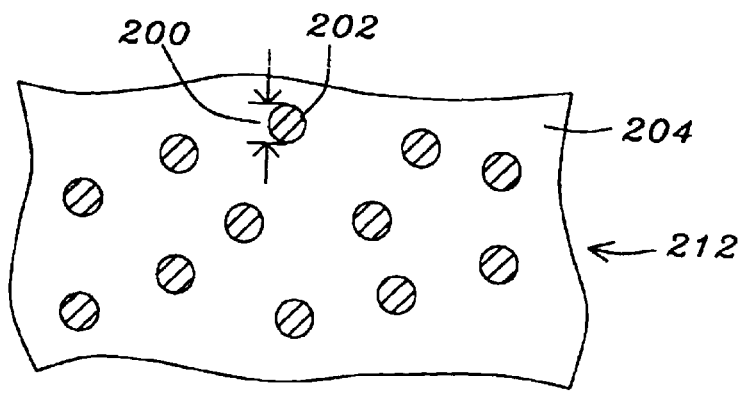
FIG. 11 shows a cross section view of a conductive loaded resin-based material comprising a powder of conductor materials.
Figure 12A:
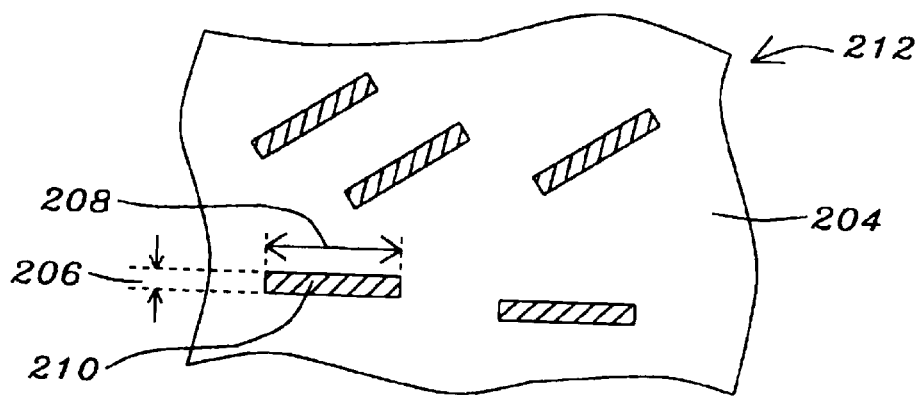
FIG. 12A shows a cross section view of a conductive loaded resin-based material comprising conductor fibers.
Figure 12B:
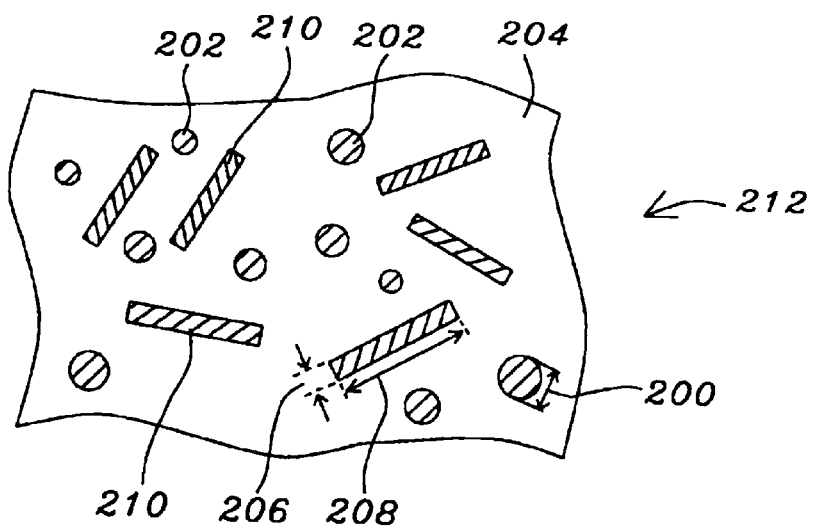
FIG. 12B shows a cross section view of a conductive loaded resin-based material comprising both micron conductor powder and micron conductor fibers.

The conductive loaded resin-based material typically comprises a powder of conductor particles, fibers of a conductor material, or a combination thereof in a base resin host. FIG. 11 shows cross section view of an example of conductor loaded resin-based material 212 having powder of conductor particles 202 in a base resin host 204. FIG. 12A shows a cross section view of an example of conductor loaded resin-based material 212 having conductor fibers 210 in a base resin host 204. FIG. 12B shows a cross section view of an example of conductor loaded resin-based material 212 having a powder of conductor particles 202 and conductor fibers 210 in a base resin host 204. In these examples the diameters 200 of the conductor particles 202 in the powder are between about 3 and 12 microns. In these examples the conductor fibers 210 have diameters of between about 3 and 12 microns, typically in the range of 10 microns or between about 8 and 12 microns, and lengths of between about 2 and 14 millimeters. The conductors used for these conductor particles 202 or conductor fibers 210 can be stainless steel, nickel, copper, silver, graphite, plated particles, plated fibers, or other suitable metals or resin. These conductor particles or fibers are homogenized within a base resin. As previously mentioned, the conductive loaded resin-based materials have a resistivity between about less than 5 and up to greater than 25 ohms per square. To realize this resistivity the ratio of the weight of the conductor material, in this example the conductor particles 202 or conductor fibers 210, to the weight of the base resin host 204 is between about 0.20 and 0.40. Stainless steel fiber of 8–11 micron in diameter with lengths of 4–6 millimeters with a fiber weight to base resin weight ratio of 0.30 will produce a very highly conductive material efficient within any EMF spectrum.

Figure 13:
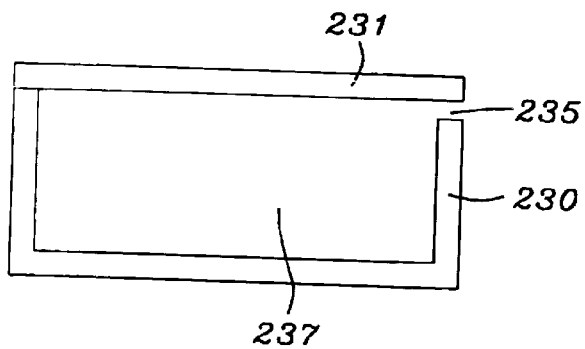
FIG. 13 shows a simplified schematic view of an apparatus for forming injection molded transductor elements.

Transductor elements formed from conductive loaded resin-based materials can be molded in a number of different ways including injection molding, extrusion, or chemically induced molding techniques. FIG. 13 shows a simplified schematic diagram of an injection mold showing a lower portion 230 and upper portion 231 of the mold. Blended conductive loaded resin-based material is injected into the mold cavity 237 through an injection opening 235 and cured thermally or chemically, producing a conductive loaded resin-based material of which the conductor material(s) are homogenized within the base resin. The upper portion 231 and lower portion 230 of the mold are then separated and the formed conductive transductor or antenna element is removed.

Figure 14:
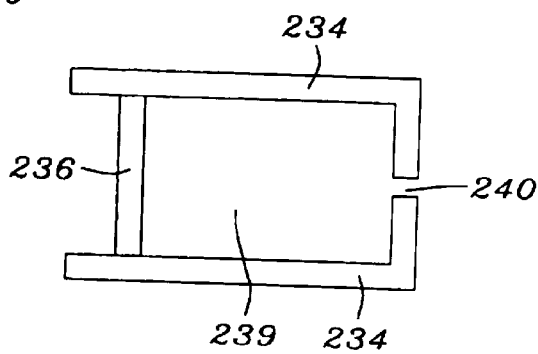
FIG. 14 shows a simplified schematic view of an apparatus for forming extruded transductor elements.

FIG. 14 shows a simplified schematic diagram of an extruder for forming antenna or transductor elements using extrusion. Raw material(s) conductive loaded resin-based material is placed in the hopper 239 of the extrusion unit 234. A piston, screw, press, or other means 236 is then used to force the thermally molten or a chemically induced curing conductive loaded resin-based material through an extrusion opening 240 which shapes the thermally molten or chemically induced cured conductive loaded resin-based material to the desired shape. The conductive loaded resin-based material is then fully cured by chemical reaction or thermal reaction to a hardened or pliable state and is ready to be handled and for use.

Figure 15A:
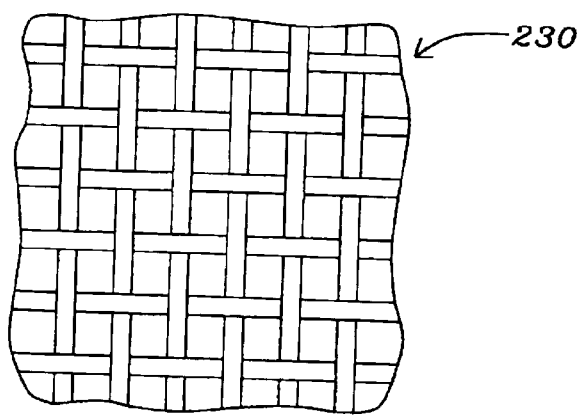
FIG. 15A shows a top view of fibers of conductive loaded resin-based material woven into a conductive fabric.
Figure 15B:
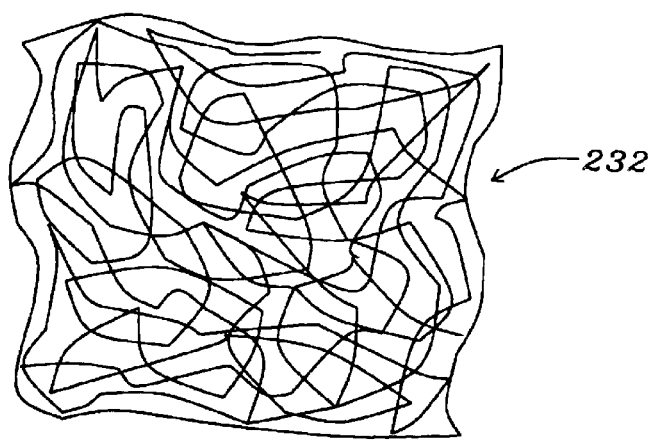
FIG. 15B shows a top view of fibers of conductive loaded resin-based material randomly webbed into a conductive fabric.

Referring now to FIGS. 15A and 15B, a preferred composition of the conductive loaded, resin-based material is illustrated. The conductive loaded resin based material can be formed into fibers or textiles that are then woven or webbed into a conductive fabric. The conductive loaded resin-based material is formed in strands that can be woven as shown. FIG. 15A shows a conductive fabric 230 where the fibers are woven together in a two-dimensional weave of fibers. FIG. 15B shows a conductive fabric 232 where the fibers are formed in a webbed arrangement. In the webbed arrangement, one or more continuous strands of the conductive fiber are nested in a random fashion within the resin. The resulting conductive fabrics 230, see FIG. 15A, and 232, see FIG. 15B, can be made very thin.

Similarly, a family of polyesters or the like can be formed using woven or webbed micron stainless steel fibers, or other micron conductive fibers, to create a metallic, but cloth-like, material. These woven or webbed conductive cloths could also be laminated to one or more layers of materials such as polyester(s), Teflon, or other resin-based material(s). This conductive fabric may then be cut into desired shapes.

Figure 16:
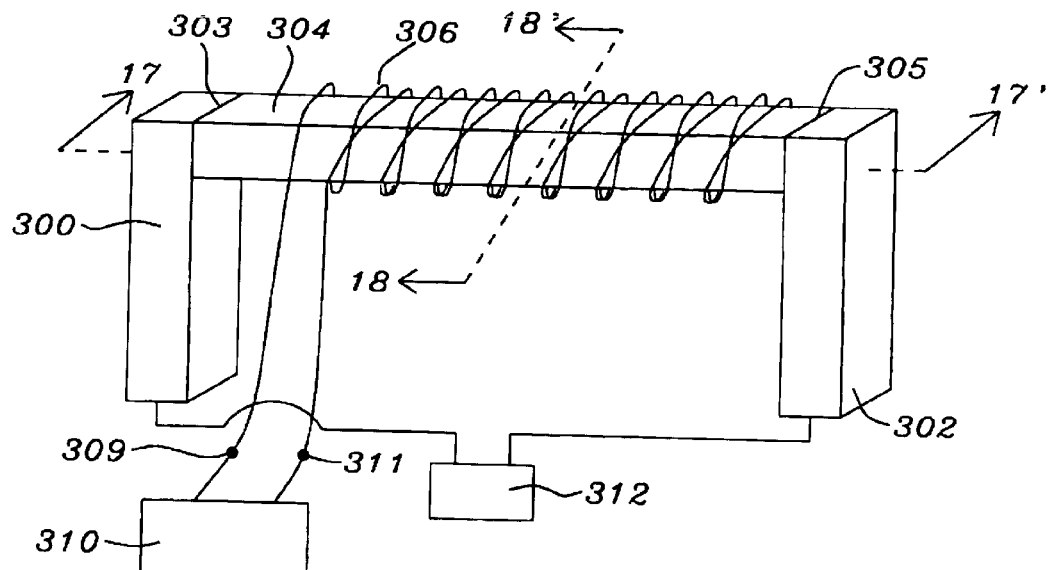
FIG. 16 shows a perspective view of a transductor of this invention formed from conductive loaded resin-based materials.
Figure 17:
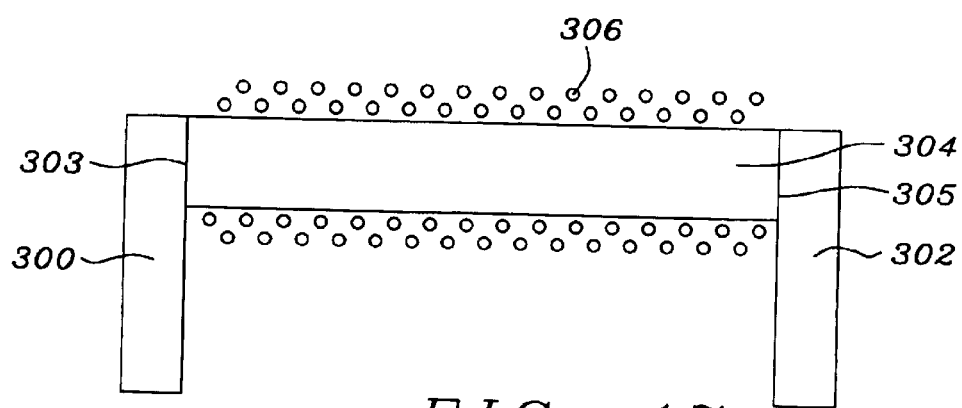
FIG. 17 shows a cross section view of the transductor of FIG. 16 taken along line 17–17' of FIG. 16.
Figure 18:
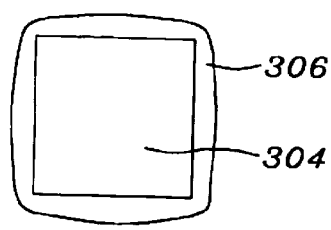
FIG. 18 shows a cross section view of the transductor of FIG. 16 taken along line 18–18' of FIG. 16.

Refer now to FIGS. 16–18 for a description of an embodiment of the electromagnetic energy transfer device of this invention, a transformer or trans-inductor, which will be referred to in this description as a transductor. FIG. 16 shows a perspective view of a transductor showing a formed bobbin 304, having a first end 303 and a second end 305, supported by a first conductive support member 300 and a second conductive support member 302. FIG. 17 shows a cross section view of the transductor taken along line 17–17' of FIG. 16. FIG. 18 shows a cross section view of the formed bobbin 304 taken along line 18–18' of FIG. 16. As shown in FIGS. 16 and 17 the first end 303 of the bobbin 304 is attached to the first support member 300 and the second end 305 of the bobbin 304 is attached to the second support member 302. The bobbin 304, the first support member 300, and the second support member 302 are formed of conductive loaded resin-based material previously described. As can be seen in FIG. 18 the bobbin 304 in this example has a rectangular cross section; although other cross section shapes, such as a circular cross section, an oval cross section, or the like could be used in place of the rectangular cross section. As can be seen in FIG. 16 the first support member 300 and the second support member 302 in this example have rectangular cross sections; although other cross section shapes, such as a circular cross section, an oval cross section, or the like could be used in place of the rectangular cross section.

As shown in FIGS. 16–18 the an number of turns of insulated wire 306, having a first end 309 and a second end 311, are wound around the bobbin 304 with overlapping windings. As shown in FIG. 16 the first end 309 and the second end 311 of the turns of insulated wire 306 are connected to electronic circuitry 310 which can serve as either a source, sink or current control for electromagnetic energy. Electromagnetic energy is coupled between current in the windings 306 and the bobbin 304 formed of conductive loaded resin-based material. The bobbin 304 is connected to the first support member 300 and second support member 302 which also are formed of conductive loaded resin-based material. Typically the first support member 300 and the second support member 302 are connected to an antenna 312, such as one of the antennas previously described. In the case of a transmitting antenna the electronic circuitry 310 serves as a source of electromagnetic energy which is delivered to the turns of wire 306, coupled onto the bobbin 304, and delivered to the antenna 312 by the first 300 and second 302 support members. In the case of a receiving antenna the antenna 312 serves as a source of electromagnetic energy which is delivered to the bobbin and coil 304 by the first 300 and second 302 support members, coupled into the turns of wire 306, and delivered to the electronic circuitry 310.

The bobbin 304, first support member 300, and second support member are formed of the conductive loaded resin-based material and can be formed by injection, compression, thermal molding, or the like, see FIGS. 13 and 14. The bobbin 304, first support member 300, and second support member, formed of the conductive loaded resin-based material, provides very efficient coupling to the turns of wire 306, is inexpensive, light, and can be shaped in any dimensional form.

The transfer of electromagnetic energy between the wire 306 and the bobbin 304 is very efficient and is typically designed to be of a limited bandwidth. The dimensions of the bobbin 304, the dimensions of the first 300 and second 302 support elements, the length of the wire in the winding 306, the thickness of the wire in the winding 306, and wiring density of the winding 306 are adjusted to determine center frequency of maximum coupling between the wire 306 and the bobbin 300. The center frequency of some applications has been designed to be between about 137 and 152 Megahertz. Center frequencies of between about 2 kilohertz and 300 gigahertz or almost any other desired frequency can be achieved.

While the invention has been particularly shown and described with reference to the preferred embodiments thereof, it will be understood by those skilled in the art that various changes in form and details may be made without departing from the spirit and scope of the invention.

What is claimed is:

1. A transductor comprising:
   a bobbin having a first end and a second end formed of a conductive loaded resin-based material, wherein said conductive loaded resin-based material comprises micron conductor fibers, micron conductor powders, or a combination of said micron conductor fibers and said micron conductor powders homogenized within a base resin host;
   a conducting wire having a preferred diameter, a first end, a second end, and an insulating coating formed thereon wound around said bobbin thereby forming a number of turns of said conducting wire wound around said bobbin formed of conductive loaded resin-based material;
   a first support member attached to said first end of said bobbin wherein said first support member is formed of said conductive loaded resin-based material;
   a second support member attached to said second end of said bobbin wherein said second support member is formed of said conductive loaded resin-based material;
   electrical connections to said first end and said second end of said conducting wire; and
   electrical connections to said first support member and said second support member.

2. The transductor of claim 1 wherein the ratio of the weight of said micron conductor fibers, said micron conductor powders, or said combination of said micron conductor fibers and said micron conductor powders to the weight of said base resin host is between about 0.20 and 0.40.

3. The transductor of claim 1 wherein said micron conductor fibers have diameters of between about 3 and 12 microns.

4. The transductor of claim 1 wherein said micron conductor fibers have diameters of between about 8 and 12 microns.

5. The transductor of claim 1 wherein said micron conductor fibers have lengths of between about 2 and 14 millimeters.

6. The transductor of claim 1 wherein said micron conductor powders are made up of micron conductor particles having a generally spherical shape with diameters of between about 3 and 12 microns.

7. The transductor of claim 1 wherein said micron conductor fibers are stainless steel, nickel, copper, silver, carbon, graphite, or plated fibers.

8. The transductor of claim 1 wherein said micron conductor powders comprise micron conductor stainless steel, nickel, copper, silver, carbon, graphite, or plated particles.

9. The transductor of claim 1 wherein said bobbin has a rectangular cross section.

10. The transductor of claim 1 wherein said first support member and said second support member have a rectangular cross section.

11. The transductor of claim 1 wherein the dimensions of said bobbin, the dimensions of said first and second support members, said diameter of said conducting wire, the winding density of said number of turns of said conducting wire, and said number of turns of said conducting wire are chosen so that said transductor has a center frequency of maximum coupling between about 137 megahertz and 152 megahertz.

12. The transductor of claim 1 wherein the dimensions of said bobbin, the dimensions of said first and second support members, said diameter of said conducting wire, the winding density of said number of turns of said conducting wire, and said number of turns of said conducting wire are chosen so that said transductor has a center frequency of maximum coupling between about 2 kilohertz and 300 gigahertz.

13. The transductor of claim 1 wherein said first end and said second end of said conducting wire are connected to a circuit or device utilizing electromagnetic energy and said first support member and said second support member are connected to an antenna.

14. The transductor of claim 1 wherein said first end and said second end of said conducting wire are connected to a circuit or device utilizing electromagnetic energy and said first support member, said second support member, and said bobbin form an antenna.

15. A method of forming a transductor comprising:

forming a bobbin having a first end and a second end of a conductive loaded resin-based material, wherein said conductive loaded resin-based material comprises micron conductor fibers, micron conductor powders, or a combination of said micron conductor fibers and said micron conductor powders homogenized within a base resin host;

winding a conducting wire having a preferred diameter, a first end, a second end, and an insulating coating formed thereon around said bobbin thereby forming a number of turns of said conducting wire wound around said bobbin formed of conductive loaded resin-based material;

forming a first support member and a second support member of said conductor loaded resin-based material;

attaching said first support member to said first end of said bobbin and said second support member to said second end of said bobbin, or forming said first support member, said second support member, and said bobbin as one unit with said first end of said bobbin attached to said first support member and said second end of said bobbin attached to said second support member;

forming electrical connections to said first end and said second end of said conducting wire; and forming electrical connections to said first support member and said second support member.

16. The method of claim 15 wherein the ratio of the weight of said micron conductor fibers, said micron conductor powders, or said combination of said micron conductor fibers and said micron conductor powders to the weight of said base resin host is between about 0.20 and 0.40.

17. The method of claim 15 wherein said forming a bobbin and said forming a first support member and a second support member and/or said forming said first support member, said second support member, and said bobbin as one unit are accomplished using molding techniques of said conductor loaded resin-based material.

18. The method of claim 15 wherein said forming a bobbin and said forming a first support member and a second support member and/or said forming said first support member, said second support member, and said bobbin as one unit are accomplished using thermo-set methods of said conductor loaded resin-based material.

19. The method of claim 15 wherein said forming a bobbin and said forming a first support member and a second support member and/or said forming said first support member, said second support member, and said bobbin as one unit are accomplished using compression of said conductor loaded resin-based material.

20. The method of claim 15 wherein said micron conductor fibers have diameters of between about 3 and 12 microns.

21. The method of claim 15 wherein said micron conductor fibers have diameters of between about 8 and 12 microns.

22. The method of claim 15 wherein said micron conductor fibers have lengths of between about 2 and 14 millimeters.

23. The method of claim 15 wherein said micron conductor powders are made up of micron conductor particles having a generally spherical shape with diameters of between about 3 and 12 microns.

24. The method of claim 15 wherein said micron conductor fibers are stainless steel, nickel, copper, silver, carbon, graphite, or plated fibers.

25. The method of claim 15 wherein said micron conductor powders comprise micron conductor stainless steel, nickel, copper, silver, carbon, graphite, or plated particles.

26. The method of claim 15 wherein said bobbin has a rectangular cross section.

27. The method of claim 15 wherein said first support member and said second support member have a rectangular cross section.

28. The method of claim 15 wherein the dimensions of said bobbin, the dimensions of said first and second support members, said diameter of said conducting wire, the winding density of said number of turns of said conducting wire, and said number of turns of said conducting wire are chosen so that said transductor has a center frequency of maximum coupling between about 137 megahertz and 152 megahertz.

29. The method of claim 15 wherein the dimensions of said bobbin, the dimensions of said first and second support members, said diameter of said conducting wire, the winding density of said number of turns of said conducting wire, and said number of turns of said conducting wire are chosen so that said transductor has a center frequency of maximum coupling between about 2 kilohertz and 300 gigahertz.

30. The method of claim 15 wherein said first end and said second end of said conducting wire are connected to a circuit or device utilizing electromagnetic energy and said first support member and said second support member are connected to an antenna or electronic device.

31. The method of claim 15 wherein said first end and said second end of said conducting wire are connected to a circuit or device utilizing electromagnetic energy and said first support member, said second support member, and said bobbin form an antenna.

* * * * *